United States Patent

Li et al.

(10) Patent No.: US 9,502,151 B2
(45) Date of Patent: Nov. 22, 2016

(54) INK COMPOSITION AND CIRCUIT BOARD AND METHOD FOR PRODUCING THE SAME

(71) Applicant: BYD COMPANY LIMITED, Shenzhen, Guangdong (CN)

(72) Inventors: Haibin Li, Guangdong (CN); Wen Hu, Guangdong (CN); Hongye Lin, Guangdong (CN)

(73) Assignee: BYD COMPANY LIMITED, Shenzhen (CN)

( * ) Notice: Subject to any disclaimer, the term of this patent is extended or adjusted under 35 U.S.C. 154(b) by 0 days.

(21) Appl. No.: 14/606,777

(22) Filed: Jan. 27, 2015

(65) Prior Publication Data

US 2015/0156871 A1    Jun. 4, 2015

Related U.S. Application Data

(63) Continuation of application No. PCT/CN2013/080399, filed on Jul. 30, 2013.

(30) Foreign Application Priority Data

Jul. 30, 2012 (CN) .......................... 2012 1 0268151

(51) Int. Cl.
| | | |
|---|---|---|
| *H01B 1/22* | (2006.01) | |
| *H05K 1/02* | (2006.01) | |
| *H05K 1/09* | (2006.01) | |
| *H05K 3/12* | (2006.01) | |
| *H05K 3/18* | (2006.01) | |
| *C09D 11/037* | (2014.01) | |
| *C09D 11/104* | (2014.01) | |
| *C09D 11/54* | (2014.01) | |
| *C09D 133/00* | (2006.01) | |
| *C09D 163/00* | (2006.01) | |
| *C09D 167/00* | (2006.01) | |
| *C09D 11/52* | (2014.01) | |

(52) U.S. Cl.
CPC ............. *H01B 1/22* (2013.01); *C09D 11/037* (2013.01); *C09D 11/104* (2013.01); *C09D 11/52* (2013.01); *C09D 133/00* (2013.01); *C09D 163/00* (2013.01); *C09D 167/00* (2013.01); *H05K 1/0298* (2013.01); *H05K 1/092* (2013.01); *H05K 3/12* (2013.01); *H05K 3/185* (2013.01); *H05K 2201/032* (2013.01); *H05K 2203/0709* (2013.01); *H05K 2203/107* (2013.01)

(58) Field of Classification Search
CPC .......... H01B 1/20; H01B 1/22; H05K 1/092; H05K 1/095; H05K 1/097; H05K 3/12; H05K 1/09; C09D 11/52; C09D 11/10; C09D 11/102; C09D 11/104; C09D 133/00; C09D 163/00; C09D 167/00
See application file for complete search history.

(56) References Cited

U.S. PATENT DOCUMENTS

| | | | | |
|---|---|---|---|---|
| 7,691,294 | B2 * | 4/2010 | Chung | C09D 5/24 242/159 |
| 7,968,011 | B2 * | 6/2011 | Overbeek | C09D 11/101 252/502 |
| 8,313,800 | B2 * | 11/2012 | Shiraishi | C09D 11/30 427/123 |
| 2006/0289839 | A1 | 12/2006 | Emmerson et al. | |
| 2010/0310761 | A1 * | 12/2010 | Tsubota | H05K 3/1208 427/98.4 |

FOREIGN PATENT DOCUMENTS

| | | | |
|---|---|---|---|
| CN | 101010388 A | | 8/2007 |
| CN | 102242354 A | * | 11/2011 |
| EP | 2333024 A1 | | 6/2011 |
| JP | 2004-217886 A | | 8/2004 |
| WO | WO 2005/111274 A2 | | 11/2005 |
| WO | WO 2014/019495 A1 | | 2/2014 |

OTHER PUBLICATIONS

PCT International Search Report and Written Opinion mailed Nov. 7, 2013, issued in International Application No. PCT/CN2013/080399 (15 pages).

* cited by examiner

*Primary Examiner* — Mark Kopec
*Assistant Examiner* — Matthew R Diaz

(57) ABSTRACT

An ink composition and a circuit board and a method for producing the same are provided. The ink composition comprises: an acrylic resin; an epoxy resin; a polyester resin; a curing agent; and an active powder comprising a modified metal compound, in which the metal element of the modified metal compound is at least one selected from the group consisting of Zn, Cr, Co, Cu, Mn, Mo, and Ni.

12 Claims, No Drawings

INK COMPOSITION AND CIRCUIT BOARD AND METHOD FOR PRODUCING THE SAME

CROSS-REFERENCE TO RELATED APPLICATIONS

This application is a continuation of International Application No. PCT/CN2013/080399, filed on Jul. 30, 2013, which claims priority to and the benefits of Chinese Patent Application No. 201210268151.6, filed with the State Intellectual Property Office of P. R. China on Jul. 30, 2012. The entire contents of the above-referenced applications are incorporated herein by reference.

FIELD

The present disclosure relates to an ink composition and applications thereof, and more particularly to an ink composition and a circuit board and a method for producing the same.

BACKGROUND

Nowadays, with the development of green and environment-friendly electrical and electronic products (e.g., mobile phones or computers), small, thin, and fine portable electrical and electronic products need to be produced, with increasingly higher requirements for their internal structure refinement.

Currently, ink is printed on inner and outer surfaces of outer and intermediate shells of an electronic product to produce a circuit instead of having a conductive circuit board inside the electronic product, thus saving space inside the electronic product and reducing the size of the electronic product. Meanwhile, since the circuit and the inner and outer surfaces of the outer shell of the electronic product are fused together into a three-dimensional carrier, the need for cumbersome processes such as surface mount technology is eliminated, fewer apparatuses are used, and costs are saved, and therefore this technique is applied to high-precision electrical and electronic products with high evaluation.

However, a conventional ink composition is used at a high temperature of 500° C. to 1000° C., and thus may be only applied to a rubber substrate rather than other substrates such as a polypropylene substrate or a polyethylene substrate commonly used in electronic products. Materials of most electronic products may be easy to deform or carbonize at this high temperature, thus affecting the electronic products adversely and limiting the application of the ink composition. Moreover, fine circuits with a small pitch may not be produced. Furthermore, ink layers formed from the ink composition are instable in ink density, and circuit boards formed from the ink composition are instable and poor in conductivity, thus restricting their practical applications.

SUMMARY

Embodiments of the present disclosure seek to solve at least one of the problems existing in the prior art to at least some extent.

According to a first aspect of the present disclosure, an ink composition is provided. The ink composition may comprise: an acrylic resin; an epoxy resin; a polyester resin; a curing agent; and an active powder comprising a modified metal compound, in which the metal element of the modified metal compound is at least one selected from the group consisting of Zn, Cr, Co, Cu, Mn, Mo, and Ni.

It has been surprisingly found by the inventors that when the ink composition comprises the acrylic resin, the epoxy resin, the polyester resin and the curing agent, the interaction between the above substances may allow the ink composition to adhere securely to most substrates (e.g., a plastic plate, a metal plate, or a metal film) used in electronic products at an ordinary temperature by a printing process (e.g., screen printing or pad printing) commonly used in a process for producing electronic products, and ink layers formed from the ink composition may not fall off when subjected to treatment under extreme conditions such as laser radiating or dipping in a highly acidized or alkalized plating solution. Thus, the ink layer may adhere to the substrate tightly and circuit boards formed from the ink composition may have good performance.

According to a second aspect of the present disclosure, a circuit board is provided. The circuit board may comprise: a substrate; a pattern layer formed by applying the ink composition described herein on the substrate to form an ink layer and laser activating the ink layer; and a metal layer formed on the pattern layer.

According to a third aspect of the present disclosure, a method for producing a circuit board is provided. The method may comprise: applying the ink composition described herein on a substrate to form an ink layer; radiating the ink layer with a laser to form a pattern layer; and forming a metal layer on the pattern layer. In some embodiments, the metal layer is formed on the pattern layer by chemical plating.

The ink layer formed from the ink composition described herein may be resistant to acids and bases, fast to cure, and have high ink density and strong adhesion, and thus the circuit board formed from the ink composition may have good conductive stability. Furthermore, metal crystal nuclei may be released from the ink layer by laser activation, chemical plating of the ink layer may be easy to carry out, metal ions such as Cu ions or Ni ions may be easily adsorbed during the chemical plating process, and the metal layer formed after chemical plating may have high electron density and strong adhesion and may be suitable to produce a fine circuit with good conductivity. Moreover, the ink layer may be applied to various substrates (e.g., a plastic plate, a metal plate, or a metal film), and have no strict requirements for the type of the substrate. The method for producing the circuit board described herein may be simple and convenient to operate and suitable to be applied to industrialized production.

Additional aspects and advantages of embodiments of present disclosure will be given in part in the following descriptions, become apparent in part from the following descriptions, or be learned from the practice of the embodiments of the present disclosure.

DETAILED DESCRIPTION

Reference will be made in detail to embodiments of the present disclosure.

According to an embodiment of the present disclosure, an ink composition is provided. The ink composition may comprise an acrylic resin, an epoxy resin, a polyester resin, a curing agent, and an active powder comprising a modified metal compound. In some embodiments, the metal element of the modified metal compound may include at least one selected from the group consisting of Zn, Cr, Co, Cu, Mn, Mo, and Ni. Thus, an ink layer formed from the ink composition may have good ink density and high adhesion to a substrate, and consequently a circuit board produced from the ink composition may have good conductivity.

In some embodiments, the modified metal compound may comprise a modified metal oxide. In some embodiments, the modified metal compound may comprise a complex of an organic chelator with a metal ion; in some embodiments, the organic chelator may include at least one selected from the group consisting of silicates, oxalates, and borates; in some embodiments, the metal ion may include at least one selected from the group consisting of Zn ions, Co ions, Cu ions, Mn ions, Mo ions, and Ni ions. In some embodiments, the active powder may comprise one or more of manganese silicate, nickel oxalate, copper oxalate, and zinc borate. In some embodiments, the active powder may have an average particle size ranging from about 2 microns to about 8 microns, thus further enhancing the coating rate of the ink composition and the adhesion of the metal layer to the substrate. In the present disclosure, the average particle size may be determined using a static laser tester and may be a volume average particle size. In some embodiments, the active powder may be commercially available, for example, may be zinc borate (HT-207) commercially available from Jinan Taixing Fine Chemicals, Co., Ltd., China.

In some embodiments, with respect to 100 weight parts of the acrylic resin, the epoxy resin may be present in an amount ranging from about 30 weight parts to about 60 weight parts, the polyester resin may be present in an amount ranging from about 10 weight parts to about 30 weight parts, the curing agent may be present in an amount ranging from about 5 weight parts to about 15 weight parts, the active powder may be present in an amount ranging from about 5 weight parts to about 10 weight parts.

The acrylic resin has excellent richness, good gloss, high hardness, and good solvent resistance, the epoxy resin has good physical and chemical properties, high adhesive strength to a surface of metallic or nonmetallic materials, and good chemical resistance, the polyester resin is easy to wet, good in processability and heat resistance, and fast to cure, and the acrylic resin, the epoxy resin and the polyester resin can be easily handled in a printing process by their intercombination and interaction. Thus, the ink layer formed from the ink composition described herein may be resistant to acids and bases, resistant to high temperatures, fast to cure, and high in adhesion. In some further embodiments, with respect to 100 weight parts of the acrylic resin, the epoxy resin may be present in an amount ranging from about 20 weight parts to about 50 weight parts, and the polyester resin may be present in an amount ranging from about 10 weight parts to about 20 weight parts. In still further embodiments, with respect to 100 weight parts of the acrylic resin, the epoxy resin may be present in an amount ranging from about 35 weight parts to about 50 weight parts, and the polyester resin may be present in an amount ranging from about 15 weight parts to about 20 weight parts.

There are no special limitations on the type of the epoxy resin, which may be various commonly used epoxy resins. In some embodiments, the epoxy resin may have an epoxy value ranging from about 0.5 mol/100 g to about 0.9 mol/100 g. In some embodiments, the epoxy resin may include at least one selected from the group consisting of a resorcinol-based epoxy resin, a diphenol-propane-based epoxy resin, and a tris(hydroxyphenyl)methane-based epoxy resin. For example, the resorcinol-based epoxy resin may include a resorcinol-formaldehyde-based epoxy resin. In some embodiments, the epoxy resin may include a bisphenol-A-based epoxy resin, bisphenol-F-based epoxy resin, or tetraphenol ethane epoxy resin.

There are no special limitations on the type of the acrylic resin, which may be various commonly used acrylic resins. In some embodiments, the acrylic resin may include at least one selected from the group consisting of a thermosetting acrylic resin, an epoxy-modified acrylic resin, a polyurethane-modified acrylic resin, and a silicone-modified acrylic resin. For example, the acrylic resin may include at least one selected from the group consisting of a trihydroxypropane triacrylate resin, a tri(propylene glycol) diacrylate resin, and a polyurethane acrylic resin. In some embodiments, the acrylic resin may include a trihydroxypropane triacrylate resin.

There are no special limitations on the type of the polyester resin, which may be various commonly used polyester resins. In some embodiments, the polyester resin may include at least one selected from the group consisting of a carboxyl polyester and a hydroxyl polyester. In some embodiments, the polyester resin may include a hydroxyl polyester.

In order to enhance the dispersion uniformity of the ink composition to form a uniform ink layer on the substrate, in some embodiments, the ink composition may further comprise a solvent. There are no special limitations on the type of the solvent, which may be various commonly used solvents. In some embodiments, the solvent may include at least one selected from the group consisting of ketones and esters; in some embodiments, the solvent may be present in an amount ranging from about 5 weight parts to about 60 weight parts, with respect to 100 weight parts of the acrylic resin. In one embodiment, the solvent may comprise about 45 wt % to about 80 wt % of butyl acetate, about 10 wt % to about 35 wt % of cyclohexanone, about 5 wt % to about 40 wt % isobutyl acetate, and about 5 wt % to about 35 wt % of isophorone, based on the total weight of the solvent.

There are no special limitations on the type of the curing agent, which may be various amine curing agents and/or anhydride curing agents to allow crosslinking reactions with the epoxy resin. In some embodiments, the curing agent may comprise about 45 wt % to about 65 wt % of polyamides, about 3 wt % to about 10 wt % of propylene glycol ether acetates, about 10 wt % to about 40 wt % of cyclohexanone, about 5 wt % to about 15 wt % of toluene or xylene, and about 3 wt % to about 10 wt % of butyl esters, based on the total weight of the curing agent. In some embodiments, the amount of the curing agent may be selected depending on the type and epoxy value of the epoxy resin. For example, when the curing agent is an amine curing agent, the theoretical amount (with respect to 100 weight parts of the epoxy resin) of the curing agent may be determined by the following formula:

$$\text{amount of curing agent} = (\text{equivalent of amine/equivalent of epoxy}) \times 100,$$

where equivalent of amine=molecular weight of amine curing agent/number of active hydrogen of amine.

When the curing agent is an anhydride curing agent, the theoretical amount (with respect to 100 weight parts of the epoxy resin) of the curing agent may be determined by the following formula:

$$\text{amount of curing agent} = \frac{K \times M \times E}{N}$$

where M is the relative molecular mass in g/mol of the curing agent;

N is the number of anhydride units in one molecule of the curing agent;

E is an epoxy value in mol/100 g; and

K is an empirical coefficient.

When no accelerant is used, K is 0.6 for a chlorine-containing anhydride, and 0.85 for other anhydrides. When a tertiary amine is used as an accelerant, K is 1.0. When a tertiary amine and $M(BF_4)_n$ are used as the accelerant, K is 0.8.

Generally, the practical amount of the curing agent may be about 0.9-1.2 times of its theoretical amount.

In some embodiments, the ink composition may further comprise an aid, which may include at least one selected from the group consisting of a leveling agent, a defoamer, and a dispersant.

The leveling agent may be used for facilitating the formation of a flat, smooth, and uniform film of the ink composition during a drying process. There are no special limitations on the type of the leveling agent, which may be commonly used materials capable of realizing the above function. In some embodiments, the leveling agent may include at least one selected from the group consisting of a polyacrylate leveling agent, a polydimethylsiloxane leveling agent, and a polymethylphenylsiloxane leveling agent. In some embodiments, the leveling agent may be various commercially available leveling agents. For example, the leveling agent may include at least one selected from the group consisting of a leveling agent BYK®-333, a leveling agent BYK®-337, and a leveling agent BYK®-341, which are commercially available from BYK company, Germany. In some embodiments, the leveling agent may include the leveling agent BYK®-333. There are no special limitations on the amount of the leveling agent. In some embodiments, the leveling agent may be present in an amount ranging from about 1 weight part to about 3 weight parts, with respect to 100 weight parts of the acrylic resin.

The defoamer may be various commonly used substances capable of inhibiting the formation of foams, destroying formed foams, or removing formed foams from a system. In some embodiments, the defoamer may include at least one selected from the group consisting of an organic polysiloxane defoamer, a polyether defoamer, and a higher alcohol defoamer. In some embodiments, the defoamer may include an organic polysiloxane defoamer. In some embodiments, the defoamer may include various commercially available defoamers. In some embodiments, the defoamer may include at least one selected from the group consisting of a defoamer BYK®-051, a defoamer BYK®-052, a defoamer BYK®-053, a defoamer BYK®-054, a defoamer BYK®-054, a defoamer BYK®-055, and a defoamer BYK®-057, which are commercially available from BYK company, Germany. In some embodiments, the defoamer may include the defoamer BYK®-053. There are no special limitations on the amount of the defoamer. In some embodiments, the defoamer may be present in an amount ranging from about 0.5 weight parts to about 3 weight parts, with respect to 100 weight parts of the acrylic resin.

The dispersant may be used for shortening the time for which individual components in the ink composition are dissolved in the solvent and enhancing the dispersion stability of the ink composition. In some embodiments, the dispersant may include an organic dispersant. In some embodiments, the dispersant may include at least one selected from the group consisting of an aliphatic amine dispersant, an alkylol amine dispersant, a cyclic unsaturated amine dispersant, an aliphatic acid dispersant, an aliphatic amide dispersant, an ester dispersant, a paraffin dispersant, a phosphate ester dispersant, a polymer dispersant such as an acrylate dispersant or a polyester dispersant, and an organic phosphine dispersant. In some embodiments, the dispersant may be various commercially available dispersants. In some embodiments, the dispersant may include at least one selected from the group consisting of a dispersant BYK®-110, a dispersant BYK®-111, a dispersant BYK®-106, a dispersant BYK®-107, and a dispersant BYK®-108, which are commercially available from BYK company, Germany. In some embodiments, the dispersant may include the dispersant BYK®-110. There are no special limitations on the amount of the dispersant. In some embodiments, the dispersant may be present in an amount ranging from about 2 weight parts to about 5 weight parts, with respect to 100 weight parts of the acrylic resin.

The ink composition of the present disclosure may also comprise other aids, for example, a curing accelerant or a viscosity regulator, without limitations.

There are no special limitations on the method for preparing the ink composition described herein. In some embodiments, the acrylic resin, the epoxy resin, the polyester resin, the active powder, and the optional aids are mixed uniformly and then mixed with the curing agent to be directly coated on the substrate. There are no special limitations on the mixing order of the acrylic resin, the epoxy resin, the polyester resin, the active powder, and the optional aids. For example, the acrylic resin, the epoxy resin, the polyester resin, the active powder, and the optional aids may be dispersed with a disperser until a predetermined particle size is reached, and then grounded with a three-roll grinder. In some embodiments, the acrylic resin, the epoxy resin, the polyester resin, the active powder, and grinding beads with a diameter ranging from about 1.0 mm to about 1.4 mm may be added into a container in a predetermined proportion, stirred constantly and maintained in a water-cooled way for about 20 min to about 40 min. Then, some solvents are added. For example, if the solvent is a mixed solvent of butyl acetate, cyclohexanone, isobutyl acetate, and isophorone, butyl acetate, cyclohexanone and isobutyl acetate may be firstly mixed uniformly in a predetermined proportion, added into the container in three portions, and stirred uniformly for about 20 min to about 40 min. Then, the optional aids such as the defoamer BYK®-052, the leveling agent BYK®-333, and the dispersant BYK®-110 may be mixed in a predetermined proportion to obtain a mixed solution, and the mixed solution may be slowly added dropwise into the container under constant stirring. After it is determined that individual key indicators of a slurry in the container are qualified, the slurry may be filtered using a filter cloth with a mesh ranging from about 120 to about 180 to obtain a filter cake. The filter cake may be grounded with a three-roll grinder. During the grinding process, isophorone may be slowly added dropwise until a particle size ranging from about 5 μm to about 10 μm is reached.

According to another aspect of the present disclosure, a circuit board is also provided. The circuit board may comprise a substrate, a pattern layer formed by applying the ink composition described herein on the substrate to form an ink layer and laser activating the ink layer, and a metal layer formed on the pattern layer.

In some embodiments, the ink layer may have a thickness ranging from about 10 μm to about 20 μm. In some further embodiments, the ink layer may have a thickness ranging from about 15 μm to about 18 μm.

There are no special limitations on the material of the substrate, which may be various materials. The ink composition of the present disclosure may be applied to various substrates. For example, the substrate may be a plastic substrate, a rubber substrate, a fiber substrate, a coating formed from a coating material, a ceramic substrate, a glass substrate, a wooden substrate, a metal plate such as a steel plate, a metal film, etc. In some embodiments, the substrate may include a steel plate for producing a shell of an electronic product. In some embodiments, the substrate may include at least one selected from the group consisting of a steel plate, an acrylonitrile-butadiene-styrene (ABS) plate, a polyethylene plate, a polypropylene plate, a polystyrene plate, and a polycarbonate plate.

There are no special limitations on the metal layer, which may include a conductive metal layer. One or more metal layers may be formed. In some embodiments, the metal layer may comprise two layers, for example, in some embodiments, an inner copper layer and an outer corrosion resistant metal layer. The material of the outer corrosion resistant metal layer may be selected from the group consisting of Au, Ni, Cr, and Ag. There are no special limitations on the thickness of the metal layer. In some embodiments, the inner copper layer may have a thickness ranging about 2 μm to about 10 μm, and the outer corrosion resistant metal layer may have a thickness ranging from about 1 μm to about 3 μm.

According to yet another aspect of the present disclosure, a method for producing the circuit board described herein is also provided. The method may comprise the following steps.

First step, the ink composition described herein may be applied on a substrate to form an ink layer.

In some embodiments, the substrate may include a plastic substrate, a rubber substrate, a fiber substrate, a coating formed from a coating material, a ceramic substrate, a glass substrate, a wooden substrate, a metal plate such as a steel plate, a metal film, etc. In some embodiments, the material of the substrate may include at least one selected from the group consisting of steel, acrylonitrile butadiene styrene, polyethylene, polypropylene, polystyrene, and polycarbonate. The ink composition of the present disclosure may have high adhesion to the substrate. In some embodiments, the substrate may also be subjected to necessary washing, etc.

Various commonly used processes may be used for applying the ink composition described herein on the substrate, for example, a process selected from the group consisting of screen printing, spray coating, laser printing, ink jet printing, pad printing, gravure printing, letterpress printing, and lithographic printing. Particular operating steps and conditions of screen printing, spray coating, laser printing, ink jet printing, pad printing, gravure printing, letterpress printing, and lithographic printing are well known in the art. In some embodiments, the applying may be performed by screen printing or pad printing. In some embodiments, the screen printing may be performed using a screen with a mesh ranging from about 200 to about 250 and a photosensitive film thickness ranging from about 12 μm to about 19 μm, thus further optimizing the precision of the circuit board. In some embodiments, the pad printing may be performed using a steel plate having a depth ranging from about 8 μm to about 10 μm, thus further optimizing the precision of the circuit board. In some embodiments, the entire surface of the substrate may be coated with the ink composition, i.e. the ink layer covers the entire surface of the substrate. In some embodiments, a circuit may be first designed, and then the ink composition may be directly printed according to the designed circuit.

In some embodiments, the ink layer may have a thickness ranging from about 10 μm to about 20 μm.

In some embodiments, after the ink composition is applied on the substrate, the method for producing the circuit board may further comprise drying the substrate coated with the ink composition to remove the volatile components in the ink composition to form the ink layer. There are no special limitations on the conditions of the drying process, which may be selected depending on the type of the ink composition, especially the type of the solvent. In some embodiments, the ink layer may be dried at a temperature ranging from about 75° C. to about 85° C. for about 1 hour to about 3 hours. The drying may be performed under an ordinary pressure or a reduced pressure.

Second step, the ink layer may be radiated with a laser to form a pattern layer.

There are no special limitations on the type of the laser. For example, a laser with a frequency ranging from about 100 kHz to about 200 kHz and a power lower than 200 W may be used. In some embodiments, the laser may have a wavelength ranging from about 200 nm to about 1000 nm. In some embodiments, the radiating may be performed at a rate of about 0.01 m/s to about 10 m/s. In some embodiments, a circuit pattern may be designed by a computer according to practical requirements, and then laser activation (e.g., laser irradiation) may be performed for a part of the ink layer where the circuit needs to be produced. Thus, metal crystal nuclei may be released from the pattern layer by laser activation, chemical plating on the ink layer may be easy to carry out, and metal ions such as Cu ions or Ni ions may be easy to be adsorbed during the chemical plating process.

Third step, a metal layer may be formed on the pattern layer, e.g., in some embodiments, by chemical plating.

In some embodiments, one or more metal layers may be formed on the pattern layer by chemical plating. In this way, a conductive circuit may be formed. There are no special limitations on the conditions of the chemical plating process, which may be commonly used chemical plating processes.

According to particular use requirements, in some embodiments, one or more chemical plating processes may be performed on the pattern layer, thus forming one or more metal layers on the pattern layer. When a plurality of chemical plating processes are performed on the pattern layer to form a plurality of metal layers, the materials and thicknesses of individual metal layers may be selected according to particular use requirements. For example, metals in individual metal layers may be identical or different. In some embodiments, the metal layer may comprise an inner copper layer and an outer corrosion resistant metal layer. In some embodiments, the outer corrosion resistant metal layer may comprise Au, Ni, Cr, or Ag. In some embodiments, the outer corrosion resistant metal layer may have a thickness ranging from about 1 μm to about 3 μm.

The present disclosure will be described below in detail with reference to examples.

In the following examples, a scanning electron microscopy (SEM) was used for determining the thickness of the ink layer, the copper layer, and the corrosion resistant metal layer.

Example 1

(1) Preparation of Ink Composition 40 g of an acrylic resin (LR-7627 commercially available from Guangzhou Matsuo-Horsense Trading Co., Ltd., China), 17 g of an epoxy resin (EPIKOTE 1009 commercially available from Guangzhou Junze Trade Co., Ltd., China), 5 g of a polyester resin (DESMOPHEN A670 BA-BAYER commercially available from Shenzhen Puruisen Industry Co., Ltd., China), 13 g of manganese silicate and grinding beads with a diameter of 1.0 mm were added into a container in a proportion, stirred constantly and maintained in a water-cooled way for 30 min. 5 g of butyl acetate, 5 g of cyclohexanone and 7 g of isobutyl acetate were mixed uniformly in proportion, added into the container in three portions, and stirred uniformly for 20 min. Then, 0.6 g of a defoamer BYK®-052, 0.8 g of a leveling agent BYK®-333 and 0.7 g of a dispersant BYK®-110 were mixed in proportion to obtain a mixed solution, and the mixed solution was slowly added dropwise into the container under constant stirring for 1 hour. After it was determined that individual key indicators of a slurry in the container were qualified, the slurry was filtered using a filter cloth with a mesh of 120 to 180 to obtain a filter cake. The filter cake was ground with a ceramic three-roll grinder commercially available from Shandong Iongxing chemical machinery group Co., LTD., China. During the grinding process, 4 g of isophorone was slowly added dropwise until a solid with a particle size of 10 μm to 20 μm was obtained. When the ink composition needed to be used, the above solid was finally mixed with 10 g of a curing agent (curing agent 585 available from BYD Co., Ltd.) to obtain the ink composition.

(2) Printing of Ink Composition

The above ink composition comprising the curing agent was fast and uniformly printed on an ABS substrate by screen printing using a screen with a mesh of 300 and a photosensitive film thickness of 15 μm. The ABS substrate coated with the ink composition was placed in an oven at a temperature of 75° C., and dried at this temperature for 2 hours so as to be completely dried to form an ink layer with a thickness of 15 μm.

(3) Laser Activation

A pattern of a circuit was designed in a computer according to practical requirements, and the ink layer was radiated at a rate of 5 m/s using a laser with a frequency of 200 kHz, a power of 200 W and a wavelength of 100 nm to form a pattern layer (i.e. a circuit pattern).

(4) Chemical Plating

The substrate formed with the pattern layer was placed in a copper plating solution for first chemical plating. The copper plating solution comprised 0.12 mol/L of $CuSO_4 \cdot 5H_2O$, 0.14 mol/L of $Na_2EDTA \cdot 2H_2O$, 10 mg/L of potassium ferrocyanide, 10 mg/L of 2,2'-bipyridine, and 0.10 mol/L of glyoxylic acid. The pH was adjusted to 12.5 to 13 with NaOH and $H_2SO_4$. The first chemical plating was performed in the copper plating solution at a temperature of 50° C. to form a copper layer with a thickness of 10 μm. Then, the substrate formed with the pattern layer and the copper layer was placed in a nickel plating solution for second chemical plating. The nickel plating solution comprised 20 g/L of $NaSO_4 \cdot 6H_2O$, 30 g/L of $Na_2H_2PO_2 \cdot H_2O$, 10 g/L of sodium acetate, 15 ml/L of lactic acid (88%), 5 ml/L of propionic acid, 10 g/L of citric acid, 5 g/L of succinic acid, 10 g/L of malic acid, 15 ml/L to 25 ml/L of potassium iodate, and sulphuric acid (10%). The second chemical plating was performed in the nickel plating solution to form a nickel layer with a thickness of 3 μm. Thus, a circuit board sample S1 was produced.

Example 2

A circuit board sample S2 was produced by a method substantially the same as that in Example 1, except that 80 g of the acrylic resin (LR-7627 commercially available from Guangzhou Matsuo-Horsense Trading Co., Ltd., China), 15 g of the epoxy resin (EPIKOTE 1009 commercially available from Guangzhou Junze Trade Co., Ltd., China), 10 g of the polyester resin (DESMOPHEN A670 BA-BAYER commercially available from Shenzhen Puruisen Industry Co., Ltd., China), and 10 g of zinc borate were used to prepare an ink composition.

Example 3

A circuit board sample S3 was produced by a method substantially the same as that in Example 1, except that 70 g of the acrylic resin (LR-7627 commercially available from Guangzhou Matsuo-Horsense Trading Co., Ltd., China), 25 g of the epoxy resin (EPIKOTE 1009 commercially available from Guangzhou Junze Trade Co., Ltd., China), 15 g of the polyester resin (DESMOPHEN A670 BA-BAYER commercially available from Shenzhen Puruisen Industry Co., Ltd., China), and 8 g of nickel oxalate were used to prepare an ink composition.

Example 4

A circuit board sample S4 was produced by a method substantially the same as that in Example 1, except that 65 g of the acrylic resin (LR-7627 commercially available from Guangzhou Matsuo-Horsense Trading Co., Ltd., China), 30 g of the epoxy resin (EPIKOTE 1009 commercially available from Guangzhou Junze Trade Co., Ltd., China), 20 g of the polyester resin (DESMOPHEN A670 BA-BAYER commercially available from Shenzhen Puruisen Industry Co., Ltd., China), and 9 g of copper oxalate were used to prepare an ink composition.

Example 5

A circuit board sample S5 was produced by a method substantially the same as that in Example 1, except that 68 g of the acrylic resin (LR-7627 commercially available from Guangzhou Matsuo-Horsense Trading Co., Ltd., China), 30 g of the epoxy resin (EPIKOTE 1009 commercially available from Guangzhou Junze Trade Co., Ltd., China), 12 g of the polyester resin (DESMOPHEN A670 BA-BAYER commercially available from Shenzhen Puruisen Industry Co., Ltd., China), and 7 g of magnesium silicate were used to prepare an ink composition.

Example 6

A circuit board sample S6 was produced by a method substantially the same as that in Example 1, except that a substrate was a polyethylene substrate.

Comparative Example 1

(1) Preparation of Ink Composition 100 g of $CuFeO_{3.9}$, 40 g of a polyacrylate resin (a polyacrylate resin solution B-850 commercially available from Shanghai King Chemical Co., Ltd., China), 5 g of butyl acetate, 5 g of cyclohexanone, 7 g of isobutyl acetate, 4 g of isophorone, 0.7 g of a dispersant BYK®-110, 0.6 g of a defoamer BYK®-052, and 0.8 g of a leveling agent BYK®-333 were mixed uniformly to obtain an ink composition.

(2) Printing of Ink Composition

The ink composition prepared above was mixed with 17 g of an epoxy resin and 10 g of a curing agent to obtain a mixture. The epoxy resin was bisphenol-A-based epoxy resin with an epoxy value of 0.58 mol/100 g. The curing agent was phthalic anhydride. The mixture was applied on a polyethylene substrate by laser printing, dried at a temperature of 100° C. for 2 hours, and then cured at a temperature of 120° C. for 1.5 hours to form an ink layer on the polyethylene substrate with a thickness of 15 microns.

(3) Chemical Plating

The substrate formed with the ink layer was subjected to chemical plating by a process the same as that in Example 1 to produce a circuit board sample DS1.
Performance Test
Adhesion The adhesion of the metal layer formed on the substrate in each sample was determined by a cross-cut process. Specifically, a surface of each sample was cut using a cross-cut knife to form 100 1 mm×1 mm grids. A gap between adjacent grids was formed to reach the bottommost part of the metal layer. Debrises in a test region were cleaned using a brush, and then an adhesive tape (3M600 gummed paper) sticked to a tested grid. One end of the adhesive tape was grasped by a hand, and the gummed paper was rapidly torn off in a vertical direction. Two identical tests were performed in the same position. The grade of the adhesion was determined according to the following standard:

grade 0: a cut edge being fully smooth and no grids falling off;

grade 1: a coating at a cut intersection being partly separated, but no more than 5% of a grid region being affected;

grade 2: more than 5% of a coating at a cut edge or a cut intersection falling off, but no more than 15% of the grid region being affected;

grade 3: a coating at a cut edge partly or fully falling off in the form of a debris, and 15% to 35% of the grid region being affected.

The test results are shown in Table 1.

TABLE 1

| Sample | Chemical plating | Adhesion before chemical plating | Test surface | Adhesion of metal layer after chemical plating | Time at which a plating layer started to form | Finish time |
|---|---|---|---|---|---|---|
| S1 | No less than 80% of a copper layer appeared after 20 min, and the entire copper layer was formed after 50 min | Grade 0 | 1 | Grade 0 | 20 min | 50 min |
|    |    |    | 2 | Grade 1 | 20 min | 50 min |
| S2 | No less than 80% of a copper layer appeared after 20 min, and the entire copper layer was formed after 50 min | Grade 0 | 1 | Grade 0 | 25 min | 50 min |
|    |    |    | 2 | Grade 1 | 20 min | 50 min |
| S3 | No less than 80% of a copper layer appeared after 20 min, and the entire copper layer was formed after 50 min | Grade 0 | 1 | Grade 1 | 26 min | 50 min |
|    |    |    | 2 | Grade 2 | 20 min | 50 min |
| S4 | No less than 80% of a copper layer appeared after 20 min, and the entire copper layer was formed after 50 min | Grade 0 | 1 | Grade 2 | 20 min | 50 min |
|    |    |    | 2 | Grade 1 | 23 min | 50 min |
| S5 | No less than 80% of a copper layer appeared after 20 min, and the entire | Grade 0 | 1 | Grade 1 | 20 min | 50 min |
|    |    |    | 2 | Grade 2 | 28 min | 50 min |

TABLE 1-continued

| Sample | Chemical plating | Adhesion before chemical plating | Test surface | Adhesion of metal layer after chemical plating | Time at which a plating layer started to form | Finish time |
|---|---|---|---|---|---|---|
| | copper layer was formed after 50 min | | | | | |
| S6 | About 30% of a copper layer was observed after 15 min, about 80% of the copper layer was formed after 30 min, and the entire copper layer was formed after 60 min | Grade 0 | 1<br>2 | Grade 1<br>Grade 1 | 15 min<br>15 min | 60 min<br>60 min |
| DS1 | No plating layer appeared | — | — | — | — | — |

The ink layer formed from the ink composition described herein has high ink density and strong adhesion, and thus the circuit board formed from the ink composition has good conductive stability. Moreover, the ink layer may be applied to various substrates, for example, may adhere to the ABS substrate, the polyethylene substrate, etc. With the method for producing the circuit board described herein, a fine circuit with good conductivity may be produced, and the method is simple and convenient to operate and suitable to be applied to industrialized production.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments can not be construed to limit the present disclosure, and changes, alternatives, and modifications can be made in the embodiments without departing from spirit, principles and scope of the present disclosure.

What is claimed is:

1. An ink composition, comprising:
   an acrylic resin;
   an epoxy resin;
   a polyester resin;
   a curing agent; and
   an active powder comprising a modified metal compound, wherein the modified metal compound comprises a complex of an organic chelator and a metal ion, wherein the metal ion of the modified metal compound is at least one selected from the group consisting of Zn, Cr, Co, Cu, Mn, Mo and Ni;
   wherein with respect to 100 weight parts of the acrylic resin, the epoxy resin is present in an amount ranging from about 30 weight parts to about 60 weight parts, the polyester resin is present in an amount ranging from about 10 weight parts to about 30 weight parts, the curing agent is present in an amount ranging from about 5 weight parts to about 15 weight parts, and the active powder is present in an amount ranging from about 5 weight parts to about 10 weight parts.

2. The ink composition according to claim 1, wherein, with respect to 100 weight parts of the acrylic resin, the epoxy resin is present in an amount ranging from about 30 weight parts to about 50 weight parts and the polyester resin is present in an amount ranging from about 10 weight parts to about 20 weight parts.

3. The ink composition according to claim 1, wherein the epoxy resin is at least one selected from the group consisting of a resorcinol-based epoxy resin, a diphenol-propane-based epoxy resin, and a tris(hydroxyphenyl)methane-based epoxy resin.

4. The ink composition according to claim 1, wherein the acrylic resin is at least one selected from the group consisting of a thermosetting acrylic resin, an epoxy-modified acrylic resin, a polyurethane-modified acrylic resin, and a silicone-modified acrylic resin.

5. The ink composition according to claim 1, wherein and the polyester resin is at least one selected from the group consisting of a carboxyl polyester and a hydroxyl polyester.

6. The ink composition according to claim 1, wherein the active powder has an average particle size ranging from about 2 microns to about 8 microns.

7. The ink composition according to claim 1, further comprising a solvent.

8. The ink composition according to claim 1, further comprising at least one aid selected from the group consisting of a leveling agent, a defoamer, and a dispersant.

9. The ink composition according to claim 1, wherein the curing agent comprises about 45 wt % to about 65 wt % of polyamides, about 3 wt % to about 10 wt % of propylene glycol ether acetates, about 10 wt % to about 40 wt % of cyclohexanone, about 5 wt % to about 15 wt % of toluene or xylene, and about 3 wt % to about 10 wt % of butyl esters, based on the total weight of the curing agent.

10. A method for producing a circuit board, comprising:
applying an ink composition on a substrate to form an ink layer;
radiating the ink layer with a laser to form a pattern layer; and
forming a metal layer on the pattern layer by chemical plating,
wherein the ink composition comprises an acrylic resin; an epoxy resin; a polyester resin; a curing agent; and an active powder comprising a modified metal compound, wherein the modified metal compound comprises a complex of an organic chelator and a metal ion, wherein the metal ion of the modified metal compound is at least one selected from the group consisting of Zn, Cr, Co, Cu, Mn, Mo and Ni; wherein with respect to 100 weight parts of the acrylic resin, the epoxy resin is present in an amount ranging from about 30 weight parts to about 60 weight parts, the polyester resin is present in an amount ranging from about 10 weight parts to about 30 weight parts, the curing agent is present in an amount ranging from about 5 weight parts to about 15 weight parts, and the active powder is present in an amount ranging from about 5 weight parts to about 10 weight parts.

11. The method according to claim 10, wherein the applying is performed by screen printing or pad printing.

12. The method according to claim 10, wherein the laser has a wavelength ranging from about 200 nm to about 1000 nm, and the radiating is performed at a rate of about 0.01 m/s to about 10 m/s.

* * * * *